(12) United States Patent
Ramalingam et al.

(10) Patent No.: US 10,848,172 B2
(45) Date of Patent: Nov. 24, 2020

(54) FORCING AND SENSING DACS SHARING REFERENCE VOLTAGE

(71) Applicant: Analog Devices International Unlimited Company, Limerick (IE)

(72) Inventors: Kirubakaran Ramalingam, Palakkad (IN); Ayan Das, West Bengal (IN); Hrishikesh Ravi Mathukkarumukku, Thrissur Dt (IN); Mahesh Madhavan Kumbaranthodiyil, Calicut (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/704,497

(22) Filed: Dec. 5, 2019

(65) Prior Publication Data

US 2020/0287561 A1 Sep. 10, 2020

(30) Foreign Application Priority Data

Mar. 4, 2019 (IN) .............................. 201941008287

(51) Int. Cl.
*H03M 1/76* (2006.01)
*H03M 1/80* (2006.01)

(52) U.S. Cl.
CPC ............. *H03M 1/76* (2013.01); *H03M 1/808* (2013.01)

(58) Field of Classification Search
USPC ................................................ 341/144, 148
See application file for complete search history.

(56) References Cited

U.S. PATENT DOCUMENTS

| 4,491,825 A | 1/1985 | Tuthill |
| 4,990,797 A | 2/1991 | Real et al. |
| 5,294,927 A | 3/1994 | Levinson et al. |
| 5,351,268 A | 9/1994 | Jensen et al. |
| 5,488,368 A | 1/1996 | Brown et al. |
| 5,602,756 A | 2/1997 | Atwood et al. |

(Continued)

OTHER PUBLICATIONS

Parguian, Joselito, "Building a Stable DAC External Reference Circuit", Texas Instruments Application Report SLAA172, (Mar. 2003), 10 pgs.

(Continued)

*Primary Examiner* — Jean B Jeanglaude
(74) *Attorney, Agent, or Firm* — Schwegman Lundberg & Woessner, P.A.

(57) ABSTRACT

An IC can include shared reference voltage buffer circuitry having an amplifier circuit. A commonly-routed amplifier shared output voltage node can be shared between at least two digital-to-analog converters (DACs) respectively via at least first and second individually routed traces from the shared output voltage node to respective first and second local reference voltage nodes at the DACs. Respective first and second routing trace resistances can be based on current draw of the corresponding DAC, such as to provide an equal voltage drop across the first and second routing resistances. This can help avoid voltage contention or conflict at the shared output voltage node from forcing/sensing the voltages at the first and second local reference voltage nodes. In a further example, at least one of the first and second individually routed traces can include a binary tree hierarchical routing arrangement of at least some of the DACs.

20 Claims, 2 Drawing Sheets

(56) References Cited

U.S. PATENT DOCUMENTS

| | | | |
|---|---|---|---|
| 5,689,259 A | 11/1997 | Ozguc | |
| 5,734,596 A | 3/1998 | Medelius et al. | |
| 5,808,576 A | 9/1998 | Chloupek et al. | |
| 5,909,244 A | 6/1999 | Waxman et al. | |
| 6,897,713 B1 | 5/2005 | Nguyen et al. | |
| 6,909,390 B2 | 6/2005 | Khoini-poorfard et al. | |
| 6,924,759 B2 | 8/2005 | Wynne et al. | |
| 6,962,436 B1 | 11/2005 | Holloway et al. | |
| 7,010,440 B1 | 3/2006 | Lillis et al. | |
| 7,281,846 B2 | 10/2007 | Mcleod | |
| 7,554,517 B2 | 6/2009 | Baum et al. | |
| 7,648,271 B2 | 1/2010 | Doorenbos et al. | |
| 7,710,302 B2 * | 5/2010 | Iadanza | H03M 1/06 341/144 |
| 7,791,519 B2 | 9/2010 | Matsukawa et al. | |
| 7,817,149 B2 | 10/2010 | Tsuge | |
| 7,884,747 B2 | 2/2011 | Mclachlan | |
| 7,948,418 B2 | 5/2011 | Cho et al. | |
| 8,154,272 B2 | 4/2012 | Kim et al. | |
| 8,154,433 B2 | 4/2012 | Mclachlan et al. | |
| 8,237,596 B2 * | 8/2012 | Zhao | H03M 1/685 341/145 |
| 8,476,971 B2 | 7/2013 | Peng et al. | |
| 8,696,199 B2 | 4/2014 | St. Pierre et al. | |
| 9,124,296 B2 | 9/2015 | Dempsey | |
| 9,130,586 B1 | 9/2015 | Raz | |
| 9,136,866 B2 | 9/2015 | Downey et al. | |
| 9,300,318 B1 | 3/2016 | Medina Sanchez-Castro | |
| 9,478,188 B1 * | 10/2016 | Chang | G09G 3/3655 |
| 9,483,034 B2 | 11/2016 | Soenen et al. | |
| 9,843,338 B1 * | 12/2017 | Newlin | H03M 1/1071 |
| 10,056,915 B2 | 8/2018 | Onishi | |
| 10,128,863 B2 * | 11/2018 | Newlin | H03M 1/1071 |
| 10,389,375 B1 * | 8/2019 | Fick | G06N 3/0635 |
| 10,523,230 B2 * | 12/2019 | Fick | H03F 3/45968 |
| 2004/0102914 A1 | 5/2004 | More | |
| 2006/0190210 A1 | 8/2006 | Mukherjee | |
| 2007/0146058 A1 | 6/2007 | Jones | |
| 2009/0160689 A1 * | 6/2009 | Iadanza | H03M 1/06 341/144 |
| 2009/0323763 A1 | 12/2009 | Raychowdhury et al. | |
| 2010/0002747 A1 | 1/2010 | Bosch et al. | |
| 2010/0017164 A1 | 1/2010 | Wallin | |
| 2011/0156935 A1 * | 6/2011 | Zhao | H03M 1/685 341/98 |
| 2012/0119930 A1 | 5/2012 | Kumar et al. | |
| 2018/0269888 A1 * | 9/2018 | Newlin | H03M 11/24 |
| 2019/0326921 A1 * | 10/2019 | Fick | H03F 3/45183 |

OTHER PUBLICATIONS

"U.S. Appl. No. 16/691,256, Non Final Office Action dated Jun. 9, 2020", 6 pgs.

* cited by examiner

FORCING AND SENSING DACS SHARING REFERENCE VOLTAGE

CLAIM OF PRIORITY

This application claims the benefit of priority of Indian Provisional Patent Application Number 201941008287, titled "ADC OUTPUT TEMPERATURE DRIFT CORRECTION AND FORCING AND SENSING DACS SHARING REFERENCE VOLTAGE" to Mahesh Madhaven, et al. and filed on Mar. 4, 2019 in the India Patent Office, the entire contents of which being incorporated herein by reference.

FIELD OF THE DISCLOSURE

This document also pertains generally, but not by way of limitation, to integrated circuit electronics and more particularly, but not by way of limitation to multiple similar or different digital-to-analog converter (DAC) circuits on an integrated circuit (IC).

BACKGROUND

An integrated circuit (IC) can include multiple digital-to-analog converter (DAC) circuits on the same IC, such as for providing multiple channels of digital-to-analog signal conversion or other signal processing. For power efficiency, multiple DACs may share a common reference voltage provided by a shared reference voltage generator circuit. Operating the DACs can heat the IC. The DACs may be located at various locations across the IC in a manner that is intended to help obtain uniform or relatively consistent temperature distribution across the IC.

SUMMARY

The present inventors have recognized, among other things, that locating digital-to-analog converter (DAC) circuits at various specified locations on an integrated circuit (IC) in a manner that is intended to help obtain uniform or relatively consistent temperature distribution across the IC may result in variations in the shared reference voltage provided at individual DAC locations, such as due to different routing impedances to the individual DACs, due to different equivalent resistances presented by the individual DACS, due to which DACs are operating and which DACs are powered down, or some combination of such factors. This document describes, among other things, an approach to specifying the routing impedances in a manner that can help a shared reference voltage generator circuit, which provides a reference voltage to multiple individual DACs, to provide a consistent or identical reference voltage at the location of the individual DACs, which may be distributed upon the IC, even when such reference-voltage-sharing DACs are different from each other, such that they present a different equivalent resistance to ground (or other reference voltage), and even when various reference-voltage-sharing DACs may be powered down or may be operating.

In some aspects, this disclosure is directed to a device or assembly including an integrated circuit comprising: reference voltage buffer circuitry, including an amplifier circuit, providing a commonly-routed amplifier shared output voltage node that is shared between at least two digital-to-analog converters (DACs) respectively via at least first and second individually routed traces from the shared output voltage node to respective first and second local reference voltage nodes located at corresponding DACs; and wherein the first and second individually routed traces are configured with respective first and second routing resistances that are based on an expected or measured current loading from the corresponding DAC to provide an equal voltage drop across the first and second routing resistances for avoiding voltage contention or conflict at the shared output voltage node from forcing/sensing the voltages at the first and second local reference voltage nodes.

In some aspects, this disclosure is directed to, in a device or assembly including an integrated circuit having reference voltage buffer circuitry including an amplifier circuit, a method of avoiding voltage contention or conflict at a commonly-routed amplifier shared output voltage node that is shared between at least two digital-to-analog converters (DACs) respectively via at least first and second individually routed traces from the shared output voltage node to respective first and second local reference voltage nodes located at corresponding DACs, the method comprising: forming the first and second individually routed traces with respective first and second routing resistances that are based on an expected or measured current loading from the corresponding DAC to provide an equal voltage drop across the first and second routing resistances for avoiding voltage contention or conflict at the shared output voltage node from forcing/sensing the voltages at the first and second local reference voltage nodes.

In some aspects this disclosure is directed to a device or assembly including an integrated circuit comprising: buffer circuitry having an output voltage node that is shared between two resistor string digital-to-analog converters (DACs) respectively via first and second individually routed traces from the output voltage node to respective first and second local reference voltage nodes located at corresponding DACs; and wherein the first and second individually routed traces are configured with respective first and second routing resistances that are based on a determined current loading from the corresponding DAC to provide an equal voltage drop across the first and second routing resistances for avoiding voltage contention at the shared output voltage node from forcing/sensing the voltages at the first and second local reference voltage nodes.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, potential advantages of an approach to specifying the routing impedances in a manner that can help a shared reference voltage generator circuit, which provides a reference voltage to multiple individual digital-to-analog converter (DAC) circuits, to provide a consistent or identical reference voltage at the location of the individual DACs, which may be distributed upon an integrated circuit (IC), even when such reference-voltage-sharing DACs are different from each other, such that they present a different equivalent resistance to ground (or other reference voltage), and even when various reference-voltage-sharing DACs may be powered down or may be operating.

In an illustrative use-case example, in an optical-to-electrical transducer signal processing use-case example, there may be around 50 DACs on a single IC die. Of these DACs, an individual DAC can include a voltage-output DAC or a current-output DAC, or both types of DACs may be present on the same IC. For power-consumption efficiency, IC area usage efficiency, or both, it can be desirable to have multiple DACs (e.g., 2, 4, 8, 16, or 20 DACs, or other plurality) share a reference voltage that is provided by a shared reference voltage buffer circuitry. In this way, on a particular IC die, groups of two or more DACs can share the same reference voltage buffer circuitry. A suitable DAC architecture for power and area efficiency in such an application is a resistor string DAC. This can be followed by a voltage buffer or a voltage-to-current converter circuit depending on whether a voltage or a current DAC is desired.

The resistor string DACs sharing the same reference voltage buffer circuitry can be of a different resolution (e.g., 10-bit DAC, 12-bit DAC, 14-bit DAC) or can have one or more different operating characteristics (e.g., conversion rate, or the like), or can have different operating states (e.g., powered-up vs. powered down, or the like). Such differences between DACs sharing a particular reference voltage buffer circuitry raise the possibility of causing a thermal gradient on the IC die. To reduce or minimize the thermal gradient, such DACs may need to be spread across different locations across the die, which can mean that such DACs that are driven by the same shared reference buffer circuitry can be located at different parts of the die, and, therefore, can have different routing parasitic resistances between the reference buffer circuitry and the DAC.

Figure 1:
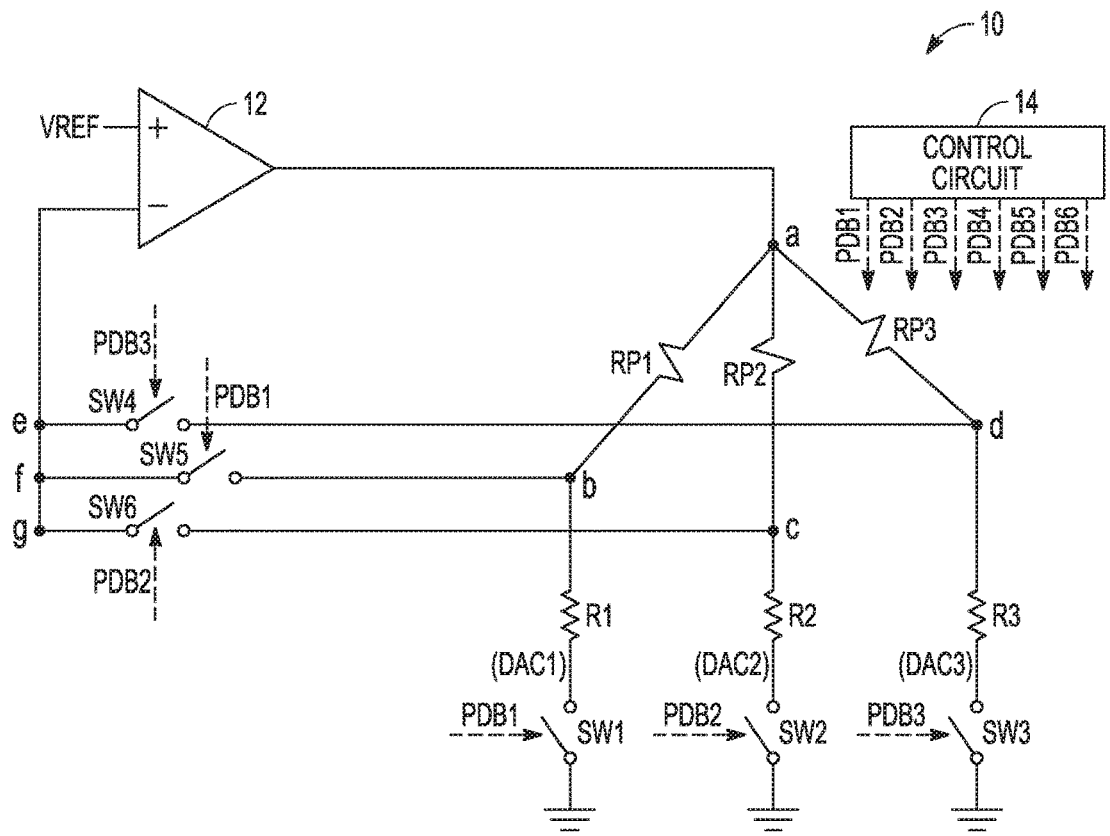
FIG. 1 shows an illustrative example in which shared buffer circuitry can be arranged to provide a reference voltage at a shared routing common node that is then individually routed via respective traces to multiple DACs.

FIG. 1 shows an illustrative example in which shared buffer circuitry 10 can include an amplifier 12, such as can be arranged in a voltage follower buffer arrangement. A temperature-stable or other reference voltage VREF (e.g., 2.5V) can be received at a non-inverting input of amplifier A for generating an output voltage at a shared routing common node "a" at the output of amplifier 12. The generated output voltage at shared routing common node "a" can be routed via respective traces to multiple DACs, such as DAC1, DAC2, and DAC3, which are respectively represented in FIG. 1 by their corresponding equivalent resistances R1, R2, and R3, shown respectively in series with corresponding power down switches SW1-SW3 to model the operating state of the DAC (e.g., switch open for DAC being off, switch closed for DAC being on). In some example configurations, the DACs are resistor string DACs.

A non-limiting example of a resistor string DAC is described in commonly assigned U.S. Pat. No. 9,124,296 to Dennis Dempsey, the entire contents of which being incorporated by reference.

In the example of FIG. 1, the buffered reference voltage at shared routing common node "a" is individually routed to the DACS represented by R1, R2, and R3 by corresponding traces having respective routing resistances of RP1, RP2, and RP3. Nodes "b", "c", and "d" establish corresponding individual local reference voltages at the locations of the corresponding DAC1, DAC2, and DAC3 represented respectively by R1, R2, and R3. The voltages at nodes "b", "c", and "d" can be forced to the same reference voltage value by the buffer circuitry, such as via their individual sense line traces back to the inverting input of the amplifier 12. In this way, it is possible to also sense the local voltages at nodes "b", "c", and "d", such as by running one or more or respective individual sense traces back from such nodes to be sensed at the inverting input of the amplifier 12 of the voltage-follower buffer circuitry 10, such as via the respective sense line traces bf, cg, or de shown in FIG. 1.

The sense line traces bf, cg, or de are relatively insensitive to routing resistance because, due to the extremely high input impedance of the amplifier 10, substantially no DC current flows through the sense line traces bf, cg, or de. Forcing/sensing the local voltages at the individually routed local reference nodes "b", "c", and "d" can create contention at the shared routing common node "a" at the output of the amplifier 12. This can be due to the different DAC equivalent resistances or operating states, or due to the different routing resistances of RP1, RP2, and RP3, or both.

To achieve good Total Unadjusted Error or good Gain Error performance, each of the DAC local reference nodes "b", "c", and "d" should be forced and sensed, but proper force/sense may be hindered due to non-identical DACs sharing a particular reference buffer 10, such as is represented by the respective DAC equivalent resistances R1, R2, and R3, which need not be identical. Improper force/sense can result in DC cross-talk between individual DAC channels, such as when one of the DAC channels is put into power down mode.

In the example of FIG. 1, for proper force/sense, local reference nodes b, c, d should each be at the reference voltage VREF, e.g., 2.5V, but for this to happen there should not be any current on the sense trace segments ed, jb, and gc. Because there can be different currents flowing through each respective DAC (individually represented by R1, R2, and R3) there can be a current flowing in the loops {abfeda} and {abfgca}, which can result in voltages at respective local reference nodes b, c, d deviating from the reference voltage, e.g., 2.5V, in the illustrative example of FIG. 1. Also, powering down a particular DAC—without providing a proper force/sense to ensure equal voltages at respective local reference nodes b, c, d—can create a loop current that can affect the force/sense of the other DACs.

The present inventors have recognized, among other things, that even in the presence of different current through each DAC, a star connection can be made to node a, but the individual routing resistances RP1, RP2, and RP3 can be specified and established or formed such that voltage drop across each of the routing resistances RP1, RP2, and RP3 can be made to be the same, thereby resolving what would otherwise be a conflict or contention at node a that would result from different voltages at local reference nodes b, c, d, such as otherwise would require the voltage at node a to settle to such average value of different voltages at local reference nodes b, c, d.

If the current loading corresponding to each individual one of DAC1, DAC2, and DAC3, can be determined, such as by estimating, assuming, or measuring, as I1, I2, I3, respectively, then the corresponding resistances values of RP1, RP2, and RP3 can be specified and established or formed such that I1*RP1=I2*RP2=I3*RP3. Such corresponding trace resistances can be specified and formed, such as by adjusting trace linewidth, trace length, or other trace resistance parameter such that I1*RP1=I2*RP2=I3*RP3. If this condition is met, then there will not be any current flow through the loops {abfeda} and {abfgca} and each of the local reference nodes b, c, d will be force/sensed to the reference voltage VREF, e.g., 2.5V.

As shown in FIG. 1, the shared buffer circuitry 10 can include power down switches SW4-SW6 in feedback paths de, bf, and cg, respectively. The power down switches SW4-SW6 can operate with power down switches SW1-SW3. For example, a control circuit 14 can output a first signal PDB1 to close switch SW1 when the DAC represented by resistor R1 is ON (not powered down). The power down signal PDB1 can also be applied to close switch SW5 in feedback path bf when the DAC represented by resistor R1 is ON (not powered down). In this manner, for whichever DAC is powered down, e.g., the DAC represented by R1, the feedback path corresponding to that DAC, e.g., feedback path bf, can be opened. Similar power down signals PDB2, PDB3 can be applied to power down switch pairs SW2/SW6 and SW3/SW4, respectively.

Figure 2:
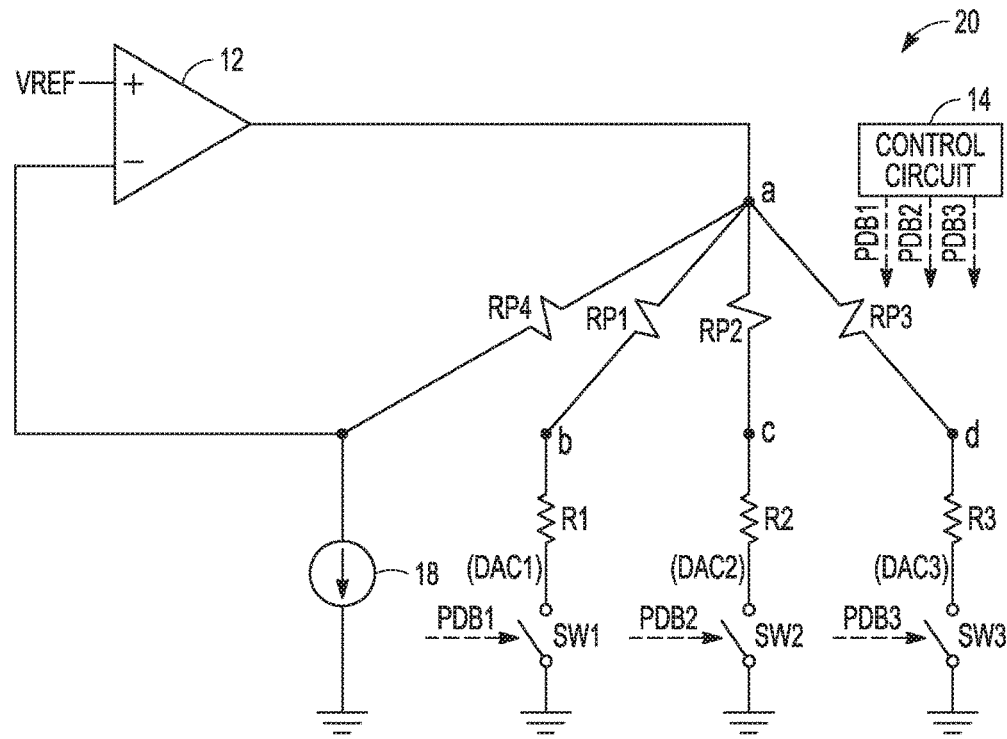
FIG. 2 shows another example in which shared buffer circuitry can be arranged to provide a reference voltage at a shared routing common node that is then individually routed via respective traces to multiple DACs.

FIG. 2 shows another example in which shared buffer circuitry can be arranged to provide a reference voltage at a shared routing common node that is then individually routed via respective traces to multiple DACs. The shared buffer circuitry 20 can include an amplifier 12, such as can be arranged in a voltage follower buffer arrangement.

A temperature-stable or other reference voltage VREF (e.g., 2.5V) can be received at a non-inverting input of amplifier 12 for generating an output voltage at a shared routing common node "a" at the output of amplifier 12. The generated output voltage at shared routing common node "a" can be routed via respective traces to multiple DACs, such as DAC1, DAC2, and DAC3, which are respectively represented in FIG. 2 by their corresponding equivalent resistances R1, R2, and R3, shown respectively in series with corresponding power down switches SW1-SW3 to model the operating state of the DAC (e.g., switch open for DAC being off, switch closed for DAC being on).

For example, a control circuit 14 can output a first signal PD1 to power down the DAC represented by resistor R1, e.g., to open the switch SW1. Similar power down signals (not depicted) can power down the DACs represented by resistors R2 and R3.

In the example of FIG. 2, the buffered reference voltage at shared routing common node "a" is individually routed to the DACS represented by R1, R2, and R3 by corresponding traces having respective routing resistances of RP1, RP2, and RP3. Like in FIG. 1, the individual routing resistances RP1, RP2, and RP3 can be specified and established or formed such that voltage drop across each of the routing resistances RP1, RP2, and RP3 can be made to be the same, thereby resolving what would otherwise be a conflict or contention at node a that would result from different voltages at local reference nodes b, c, d, such as otherwise would require the voltage at node a to settle to such average value of different voltages at local reference nodes b, c, d.

In contrast to the example shown in FIG. 1, the buffer circuitry 20 in FIG. 2 includes a single feedback path 16 to the inverting input of the amplifier 12. That is, the configuration 20 in FIG. 2 does not include a separate feedback path corresponding to each DAC, as in the buffer circuitry 10 in FIG. 1. More than one feedback path can be used but only one is necessary because the current source/dummy DAC path can be always ON.

In addition, the configuration in FIG. 2 can utilize a current source 18 coupled to the node a via a routing resistance RP4. In some examples, the current source 18 can be always ON. If "I" is the current through the current source, and I1, I2 and I3 are the currents through the DACs, it is desirable to ensure that I*RP4=I1*RP1=I2*RP2=I3*RP3. In such a case, sensing will be perfect even if one of the DACs is powered down. In some example configurations, the current source 18 can be a dummy or replica DAC, such as another resistor string DAC similar to R1, R2 and R3, but not necessarily with the same equivalent resistance to ground. In such an implementation, the current "I" in the above equation needs to be replaced with the current through the dummy DAC. Using a dummy DAC, which is always ON, ensures that the above equation holds true across temperature and process variations.

Figure 3:
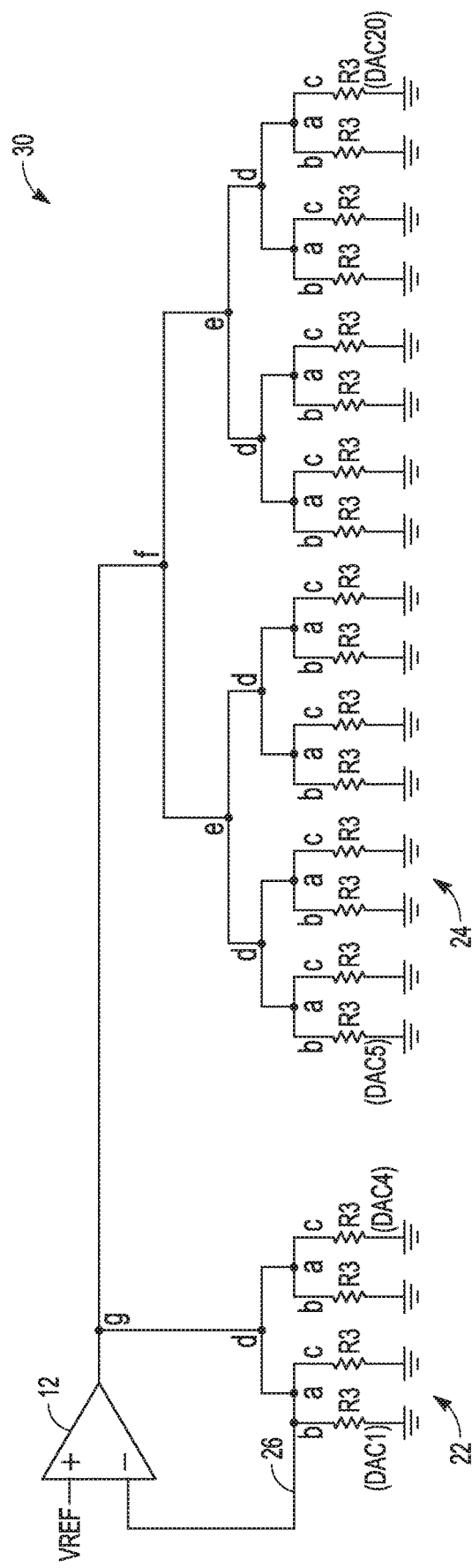
FIG. 3 shows an illustrative example of a binary tree hierarchical routed arrangement of two or more groups of similar DACs can be placed at different locations, while still sharing the same reference voltage circuitry for forcing/sensing various local reference voltages provided to individual DACs.

FIG. 3 shows an illustrative example of a binary tree hierarchical routed arrangement of two or more groups of similar DACs (such as can be represented by the same equivalent resistance R3 in FIG. 3) that can be placed at different corners of the IC die, while still sharing the same reference voltage circuitry 20 for forcing/sensing a reference voltage provided to individual DACs. For example, FIG. 3 depicts a first groups of DACs at 22, e.g., 4 DACs, and a second group of DACs at 24, e.g., 16 DACs. Again, each DAC is represented by equivalent resistance R3 in FIG. 3.

In an example, such as shown in FIG. 3, all the DACs can be powered on, therefore, the respective series switches (modeling powering down of the respective DACs) can be omitted. In an example, such as shown in FIG. 3, the number of DACs in each group can be different.

A similar technique, such as explained above for force-sensing without creating a conflict, can be applied in examples similar to that shown in FIG. 3, such as to avoid contention at the commonly-routed shared output node g, such as explained further herein. In an example, the present techniques need not cancel the DC cross-talk due to power-down of an individual DAC, but will result in proper force/sense force-sensing without creating a voltage contention or conflict at the commonly-routed shared output node g, or without creating a voltage contention or conflict at lower hierarchical nodes in the binary tree routed hierarchical arrangement.

In the simplified example shown in FIG. 3, for illustrative clarity, like DACs can be assumed, at least for the purposes of initial explanation. Each like DAC is represented by a like equivalent resistor R3 having the same resistance value. In the non-limiting example shown in FIG. 3, four DACs (DAC1-DAC4) can be placed at one corner of the IC die and sixteen DACs (DAC5-DAC20) can be placed at another corner of the IC die, but all twenty of these DACs can be driven by the same shared reference buffer circuitry 20.

The individual groups of DACs can each be routed in a binary-tree-like hierarchical routing trace arrangement, such as shown in FIG. 3. This arrangement gives rise to considerable symmetry, which can be leveraged in combination with the routing voltage-drop equalization techniques explained above. In FIG. 3, symmetrical nodes are named by same node letter name. Local reference voltage nodes b, c carry the local reference voltage VREF, e.g., 2.5V, provided locally to each DAC. In FIG. 3, one sense line is sufficient because all the DACs are always ON.

A sense line 26 is drawn from reference buffer 12, such as can be connected for force/sense to local reference voltage node b, for example, from any one of the DACs at the bottom of an individual hierarchically routed group of DACs. The sense line 26 can couple the first group of DACs 22 to the reference buffer 12. The configuration 30 in FIG. 3 does not need a separate feedback path corresponding to the second group of DACs 24.

As explained above, the goal for achieving proper force/sense is that the voltage driven back to node g from each tree-hierarchy routed group should be same, such as to avoid creating a voltage contention or conflict at node g that would otherwise result in voltage-averaging at node g, such as explained above.

In FIG. 3, the parasitic routing trace resistances can be specified and established or formed such that the routing resistance across each segment ab is the same as the routing resistance of each segment ac, for the case where the DACs are similar such that the DACs can be modeled by identical equivalent resistances R3. Similarly, the routing trace resistances can be specified and established or formed to be identical for each routing segment ad, and to be identical for each routing segment de, and to be identical for each routing segment ef. Then, by symmetry, the voltages on each node d will be the same across both of the groups of DACs. Assuming a like current I3 through each DAC (such as illustrated by the like equivalent resistances R3 of FIG. 3), a proper force/sense can be established such as by specifying appropriate relationships between routing resistances to achieve the goal of avoiding creating a voltage conflict at node g that would otherwise voltage-averaging at node g:

$$RP(gd)*4*I3 = RP(ed)*4*I3 + RP(ef)*8*I3 + RP(fg)*16*I3$$

$$\Rightarrow RP(gd) = RP(ed) + RP(ef)*2 + RP(fg)*4$$

In case of a modification to FIG. 3 in which the DACs can be different (e.g., different currents, different equivalent resistances), then within each group, the hierarchical tap point should be adjusted such that voltage driven back to each node from any DAC path is the same, such as to avoid a node voltage conflict at that node and, consequently, to avoid a node voltage contention or conflict at higher nodes in the hierarchy, including the highest node g in the hierarchy. For example, in a particular pair of DACs below a particular node a, if the DAC between node c and ground draws twice the current of its paired DAC between node b and ground, then the resistance on the segment ac should be made half the resistance of the segment ba, so that both DACs drive the same voltage back to node a.

Other trace resistances can be similarly specified or established up the binary tree hierarchy, such as to drive back a consistent node voltage to higher nodes in the hierarchy and, ultimately, to avoid any voltage contention conflict at the highest node g in the binary tree hierarchy. In sum, although FIG. 3 shows similar DACs having like equivalent resistances R3, this is not required, but merely simplified the discussion and analysis with respect to FIG. 3. If the equivalent-resistance-establishing characteristics of a particular DAC are known, then the trace resistances in the binary tree arrangement can be specified and adjusted to accommodate such DAC differences.

In many cases, the DAC characteristics can be established prior to manufacture (such as by computer modeling and simulation), such that the routing resistances can be specified and established at manufacture (such as by varying routing trace linewidth or length or other resistance characteristic). In a case in which a DAC characteristic can be measured in use, a programmable resistance element can be used, responsive to such measured DAC characteristic, such as to modify the routing resistance using the programmable resistance element, such as to operate in a manner that drives back a consistent node voltage to higher nodes in the hierarchy and, ultimately, to avoid any voltage conflict at the highest node g in the binary tree hierarchy.

Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment.

The claimed invention is:

1. A device or assembly including an integrated circuit comprising:
    reference voltage buffer circuitry, including an amplifier circuit, providing a commonly-routed amplifier shared output voltage node that is shared between at least two digital-to-analog converters (DACs) respectively via at least first and second individually routed traces from the shared output voltage node to respective first and second local reference voltage nodes located at corresponding DACs; and
    wherein the first and second individually routed traces are configured with respective first and second routing resistances that are based on an expected or measured current loading from the corresponding DAC to provide an equal voltage drop across the first and second routing resistances for avoiding voltage contention or conflict at the shared output voltage node from forcing/sensing the voltages at the first and second local reference voltage nodes.

2. The device or assembly of claim 1, further comprising:
    at least two switches corresponding to the at least two DACs, wherein each switch is positioned in series with its corresponding DAC, and wherein each switch is configured to be closed when its corresponding DAC is ON.

3. The device or assembly of claim 2, wherein the at least two switches are first switches, the device or assembly further comprising:
    at least two feedback paths coupled between corresponding ones of the respective first and second local reference voltage nodes and the amplifier circuit; and
    at least two second switches positioned within corresponding ones of the at least two feedback paths, wherein each second switch is configured to be closed when its corresponding DAC is ON.

4. The device or assembly of claim 2, the device or assembly further comprising:
    a feedback path coupled between the first local reference voltage node and the amplifier circuit; and
    a current source coupled to the feedback path.

5. The device or assembly of claim 4, wherein the current source is a replica DAC.

6. The device or assembly of claim 1, wherein the at least two DACs include resistor string DACs.

7. The device or assembly of claim 1, wherein at least one of the first and second individually routed traces includes a binary tree hierarchical routing arrangement of at least some of the at least two DACs.

8. In a device or assembly including an integrated circuit having reference voltage buffer circuitry including an amplifier circuit, a method of avoiding voltage contention or conflict at a commonly-routed amplifier shared output voltage node that is shared between at least two digital-to-analog converters (DACs) respectively via at least first and second individually routed traces from the shared output voltage node to respective first and second local reference voltage nodes located at corresponding DACs, the method comprising:
    forming the first and second individually routed traces with respective first and second routing resistances that are based on an expected or measured current loading from the corresponding DAC to provide an equal voltage drop across the first and second routing resistances for avoiding voltage contention or conflict at the shared output voltage node from forcing/sensing the voltages at the first and second local reference voltage nodes.

9. The method of claim 8, wherein forming the first and second individually routed traces with respective first and second routing resistances comprises:
    adjusting a linewidth of at least one of the first and second individually routed traces.

10. The method of claim 8, wherein forming the first and second individually routed traces with respective first and second routing resistances comprises:
    adjusting a length of at least one of the first and second individually routed traces.

11. The method of claim 8, further comprising:
    controlling a switch corresponding to one of the at least two DACs to be open when its corresponding DAC is OFF, wherein the switch is positioned in series with its corresponding DAC.

12. The method of claim 11, wherein the switch is a first switch, the method further comprising:
    forming at least two feedback paths between corresponding ones of the respective first and second local reference voltage nodes and the amplifier circuit; and
    controlling a second switch positioned within a corresponding one of the at least two feedback paths to be open when its corresponding DAC is OFF.

13. The method of claim 11, wherein the switch is a first switch, the method further comprising:
    forming a feedback path between the first local reference voltage node and the amplifier circuit; and
    controlling a current source coupled to the feedback path to be ON regardless of a power state of the at least two DACs.

14. The method of claim 13, wherein controlling a current source coupled to the feedback path to be ON regardless of a power state of the at least two DACs includes:
    controlling a replica DAC coupled to the feedback path to be ON regardless of a power state of the at least two DACs.

15. The method of claim 8, wherein the at least two DACs include resistor string DACs.

16. The method of claim 8, wherein at least one of the first and second individually routed traces includes a binary tree hierarchical routing arrangement of at least some of the at least two DACs.

17. A device or assembly including an integrated circuit comprising:
- buffer circuitry having an output voltage node that is shared between two resistor string digital-to-analog converters (DACs) respectively via first and second individually routed traces from the output voltage node to respective first and second local reference voltage nodes located at corresponding DACs; and
- wherein the first and second individually routed traces are configured with respective first and second routing resistances that are based on a determined current loading from the corresponding DAC to provide an equal voltage drop across the first and second routing resistances for avoiding voltage contention at the shared output voltage node from forcing/sensing the voltages at the first and second local reference voltage nodes.

18. The device or assembly of claim 17, further comprising:
- at least two switches corresponding to the at least two DACs, wherein each switch is positioned in series with its corresponding DAC, and wherein each switch is configured to be closed when its corresponding DAC is ON.

19. The device or assembly of claim 18, wherein the at least two switches are first switches, the device or assembly further comprising:
- at least two feedback paths coupled between corresponding ones of the respective first and second local reference voltage nodes and the amplifier circuit; and
- at least two second switches positioned within corresponding ones of the at least two feedback paths, wherein each second switch is configured to be closed when its corresponding DAC is ON.

20. The device or assembly of claim 19, the device or assembly further comprising:
- a feedback path coupled between the first local reference voltage node and the amplifier circuit; and
- a current source coupled to the feedback path.

* * * * *